(12) United States Patent
Lin

(10) Patent No.: US 11,915,749 B2
(45) Date of Patent: Feb. 27, 2024

(54) RESISTIVE MEMORY DEVICE AND FORMING METHOD THEREOF WITH IMPROVED FORMING TIME AND IMPROVED FORMING UNIFORMITY

(71) Applicant: eMemory Technology Inc., Hsinchu (TW)

(72) Inventor: I-Lang Lin, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 114 days.

(21) Appl. No.: 17/655,793

(22) Filed: Mar. 22, 2022

(65) Prior Publication Data

US 2022/0366979 A1 Nov. 17, 2022

Related U.S. Application Data

(60) Provisional application No. 63/188,466, filed on May 14, 2021.

(51) Int. Cl.
*G11C 13/00* (2006.01)

(52) U.S. Cl.
CPC ...... *G11C 13/0026* (2013.01); *G11C 13/0064* (2013.01); *G11C 13/0069* (2013.01); *G11C 13/003* (2013.01); *G11C 13/004* (2013.01); *G11C 13/0023* (2013.01); *G11C 2013/0083* (2013.01)

(58) Field of Classification Search
CPC ............ G11C 13/0026; G11C 13/0064; G11C 13/0069; G11C 13/0023; G11C 13/003; G11C 2013/0083
See application file for complete search history.

(56) References Cited

U.S. PATENT DOCUMENTS

| | | | |
|---|---|---|---|
| 8,995,169 B1 | 3/2015 | Bandyopadhyay et al. | |
| 9,183,925 B2 | 11/2015 | Katoh et al. | |
| 9,627,058 B2 | 4/2017 | Wu et al. | |
| 2008/0144356 A1* | 6/2008 | Oh | G11C 13/0069 365/148 |
| 2011/0305070 A1* | 12/2011 | Ishihara | G11C 13/0007 365/148 |
| 2012/0230085 A1* | 9/2012 | Kawai | H01L 27/101 365/148 |
| 2012/0300532 A1 | 11/2012 | Yamazaki et al. | |
| 2014/0104931 A1* | 4/2014 | Katoh | G11C 13/0007 365/148 |

(Continued)

*Primary Examiner* — Mushfique Siddique
(74) *Attorney, Agent, or Firm* — CKC & Partners Co., LLC

(57) ABSTRACT

A resistive memory device includes word lines, first memory cells, second memory cells, bit lines, source lines, and a driver. The driver provides a forming voltage to the first memory cells and the second memory cells through the bit lines and the source lines in a forming process. A first connection length along the bit lines and the source lines between the first memory cells and the driver is longer than a second connection length along the bit lines and the source lines between the second memory cells and the driver. The forming process is performed to the first memory cells before the forming process is performed to the second memory cells. A first value of the forming voltage provided to the first memory cells is less than a second value of the forming voltage provided to the second memory cells.

14 Claims, 5 Drawing Sheets

(56) References Cited

U.S. PATENT DOCUMENTS

| | | | |
|---|---|---|---|
| 2014/0241035 A1* | 8/2014 | Siau | G11C 7/20 |
| | | | 365/148 |
| 2015/0023115 A1 | 1/2015 | Chen et al. | |
| 2016/0042789 A1 | 2/2016 | Siau et al. | |
| 2020/0279606 A1* | 9/2020 | Tomita | G11C 13/0069 |
| 2023/0046230 A1* | 2/2023 | Lai | G11C 13/003 |

* cited by examiner

|  | A1 | A2 | A3 | A4 |
|---|---|---|---|---|
| VH_F | 3V+0V | 3V+0.1V | 3V+0.2V | 3V+0.2V |
| VL_F | 2.5V+0V | 2.5V+0.1V | 2.5V+0.2V | 2.5V+0.2V |
| Icmp | 125uA+0uA | 125uA+25uA | 125uA+50uA | 125uA+75uA |

FIG. 5

RESISTIVE MEMORY DEVICE AND FORMING METHOD THEREOF WITH IMPROVED FORMING TIME AND IMPROVED FORMING UNIFORMITY

RELATED APPLICATIONS

This application claims priority to U.S. Provisional Application Ser. No. 63/188,466, filed May 14, 2021, the disclosures of which are incorporated herein by reference in their entireties.

BACKGROUND

Technical Field

The present disclosure relates to memory technology. More particularly, the present disclosure relates to a resistive memory device and a forming method thereof with improved forming time and improved forming uniformity.

Description of Related Art

With developments of technology, various memories are developed. The resistive random-access memory is a non-volatile memory and has an advantage of larger storage capacity and faster access speed. It needs to perform a forming process to the resistive random-access memory in advance to initial the resistive random-access memory. After the forming process, the resistive random-access memory can work between a set state and a reset state to store corresponding values (e.g., logic values 1 and 0). The forming voltage of the forming process may be gradually increased due to IR drop and leakage currents, which increases forming time and worsens the forming uniformity. The memory device and forming method in the present disclosure is provided to avoid leakage currents to improve forming time and forming uniformity of the forming process.

SUMMARY

Some aspects of the present disclosure are to a resistive memory device. The resistive memory device includes a plurality of word lines, a plurality of first memory cells, a plurality of second memory cells, a plurality of bit lines, a plurality of source lines, and a driver. The first memory cells are coupled to the word lines. The second memory cells are coupled to the word lines. The bit lines are coupled to the first memory cells and the second memory cells. The source lines are coupled to the first memory cells and the second memory cells. The driver is configured to provide a forming voltage to the first memory cells and the second memory cells through the bit lines and the source lines in a forming process performed to the first memory cells and the second memory cells. A first connection length along the bit lines and the source lines between the first memory cells and the driver is longer than a second connection length along the bit lines and the source lines between the second memory cells and the driver, and the forming process is performed to the first memory cells before the forming process is performed to the second memory cells. During the forming process, a first value of the forming voltage provided to the first memory cells is less than a second value of the forming voltage provided to the second memory cells.

Some aspects of the present disclosure are to provide a forming method for a resistive memory device. The forming method includes following operations: setting a forming voltage provided from a driver for a plurality of first memory cells in the resistive memory device and a plurality of second memory cells in the resistive memory device, in which a first connection length along a plurality of bit lines and a plurality of source lines between the first memory cells and the driver is longer than a second connection length along the bit lines and the source lines between the second memory cells and the driver; performing a forming process to the first memory cells according to the forming voltage; and performing the forming process to the second memory cells according to the forming voltage after the forming process is performed to the first memory cells. A first value of the forming voltage provided to the first memory cells is less than a second value of the forming voltage provided to the second memory cells.

Based on the descriptions above, in the present disclosure, the forming time and the forming uniformity of the resistive memory device can be improved.

BRIEF DESCRIPTION OF THE DRAWINGS

The disclosure can be more fully understood by reading the following detailed description of the embodiment, with reference made to the accompanying drawings as follows:

FIG. 5 is a schematic diagram illustrating values of a bit line voltage, values of a source line voltage, and values of a compliance current for different zones according to some embodiments of the present disclosure.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
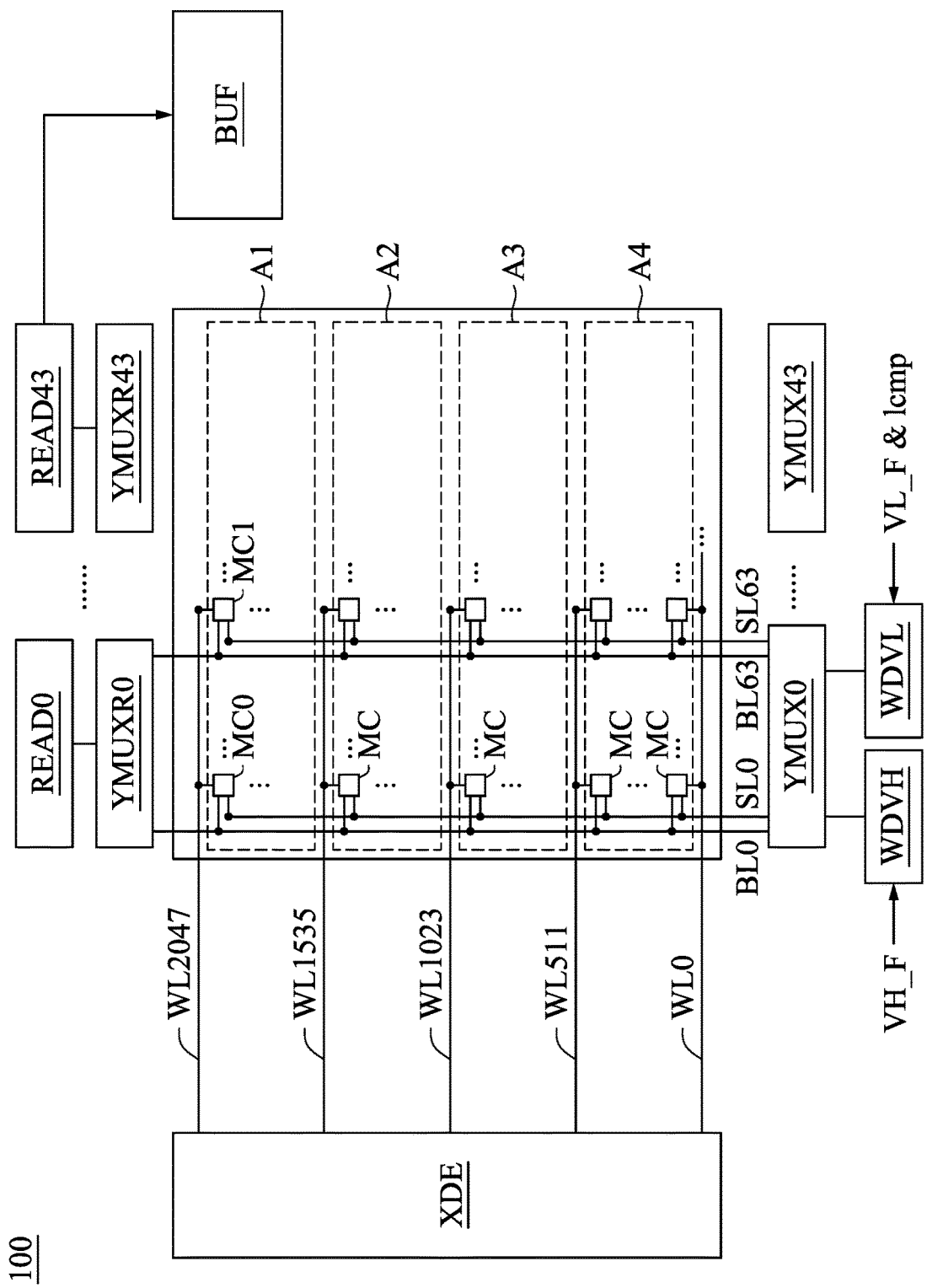
FIG. 1 is a schematic diagram illustrating a resistive memory device according to some embodiments of the present disclosure.

Reference is made to FIG. 1. FIG. 1 is a schematic diagram illustrating a resistive memory device 100 according to some embodiments of the present disclosure.

As illustrated in FIG. 1, the resistive memory device 100 includes memory cells MC, bit lines BL0-BL63, word lines WL0-WL2047, source lines SL0-SL63, drivers WDVH-WDVL, multiplexers YMUX0-YMUX43, a decoder XDE, multiplexers YMUXR0-YMUXR43, read circuits READ0-READ43, and a page buffer BUF. The drivers WDVH-WDVL can be implemented by Application Specific Integrated Circuits (ASICs) which include multiplexers, voltage sources, current sources, or other electrical elements (e.g., transistors, resistors, capacitors, amplifiers, and so on).

The memory cells MC are arranged in an array form. The bit lines BL0-BL63, the word lines WL0-WL2047, and the source lines SL0-SL63 are coupled to the memory cells MC. One of the drivers WDVH and one of the drivers WDVL are coupled to one of the multiplexers YMUX0-YMUX43 respectively. For example, the driver WDVH and the driver WDVL shown in FIG. 1 are coupled to the multiplexer YMUX0, and the multiplexer YMUX0 is coupled to the bit lines BL0-BL63 and the source lines SL0-SL63. The driver WDVH and the driver WDVL are configured to provide a forming voltage in a forming process of the memory cells MC. In detail, the forming voltage includes a bit line voltage VH_F and source line voltage VL_F. For example, the driver WDVH is configured to receive the bit line voltage VH_F and provide the bit line voltage VH_F to the memory cells MC through the multiplexer YMUX0 and the bit lines BL0-BL63. The driver WDVL is configured to receive the source line voltage VL_F and provide the source line voltage VL_F to the memory cells MC through the multiplexer YMUX0 and the source lines SL0-SL63. The driver WDVL is further configured to receive a compliance current Icmp and provide the compliance current Icmp to the memory cells MC through the multiplexer YMUX0. In other words, the multiplexer YMUX0 can connect the driver WDVH and the driver WDVL to one assigned memory cell MC according to an assigned address in order to provide the bit line voltage VH_F, the source line voltage VL_F, and the compliance current Icmp to the assigned memory cell MC. Other multiplexers have the similar structure and operations, so they are omitted in FIG. 1 and in the descriptions. The decoder XDE is coupled to the word lines WL0-WL2047. The multiplexers YMUXR0-YMUXR43 are coupled to the bit lines BL0-BL63. The read circuits READ0-READ43 are coupled to the multiplexers YMUXR0-YMUXR43 respectively, and coupled to the page buffer BUF.

As illustrated in FIG. 1, according to a connection length along the bit lines/source lines between the memory cells MC and the driver WDVH (WDVL), the memory cells MC may be grouped into 4 zones A1-A4. The memory cells MC located in the zone A1 are connected to the word lines between the word line WL2047 and the word line WL1535, the memory cells MC located in the zone A2 are connected to the word lines between the word line WL1535 and the word line WL1023, the memory cells MC located in the zone A3 are connected to the word lines between the word line WL1023 and the word line WL511, and the memory cells MC located in the zone A4 are connected to the word lines between the word line WL511 and the word line WL0.

Accordingly, a connection length between the memory cells MC in the zone A1 and the driver WDVH (WDVL) is longer than a connection length between the memory cells MC in the zone A2 and the driver WDVH (WDVL). The connection length between the memory cells MC in the zone A2 and the driver WDVH (WDVL) is longer than a connection length between the memory cells MC in the zone A3 and the driver WDVH (WDVL). The connection length between the memory cells MC in the zone A3 and the driver WDVH (WDVL) is longer than a connection length between the memory cells MC in the zone A4 and the driver WDVH (WDVL). In other words, the memory cells MC in zone A1 are located at the farthest end of the bit lines/source lines from the driver WDVH (WDVL), and the memory cells MC in zone A4 are located at the nearest end of the bit lines/source lines SL from the driver WDVH (WDVL), and thus the memory cells MC in zone A1 experience the largest IR drop along the bit lines/source lines.

The quantity (e.g., 4) of the zones in FIG. 1 is merely for illustration, but the present disclosure is not limited thereto. Various suitable quantities of the zones are within the contemplated scope of the present disclosure.

Figure 2:
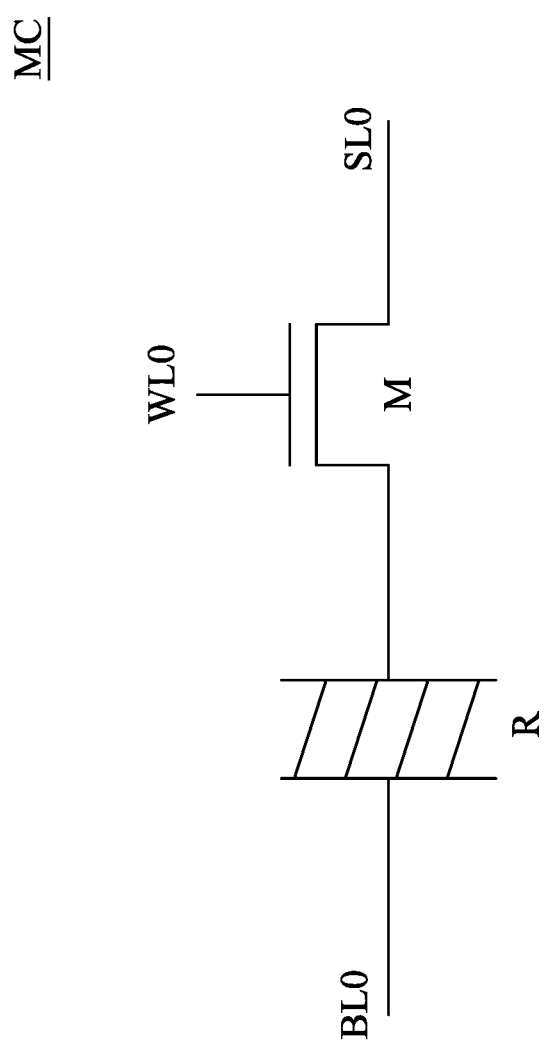
FIG. 2 is a schematic diagram illustrating one memory cell according to some embodiments of the present disclosure.

Reference is made to FIG. 2. FIG. 2 is a schematic diagram illustrating one memory cell MC according to some embodiments of the present disclosure.

As illustrated in FIG. 2, the memory cell MC includes a resistive memory R and a transistor M. The resistive memory R is, for example, a resistive random-access memory (ReRAM). A first terminal of the resistive memory R is coupled to the bit line BL0, and a second terminal of the resistive memory R is coupled to a first terminal of the transistor M. A second terminal of the transistor M is coupled to the source line SL0, and a control terminal of the transistor M is coupled to the word line WL0.

Figure 3:
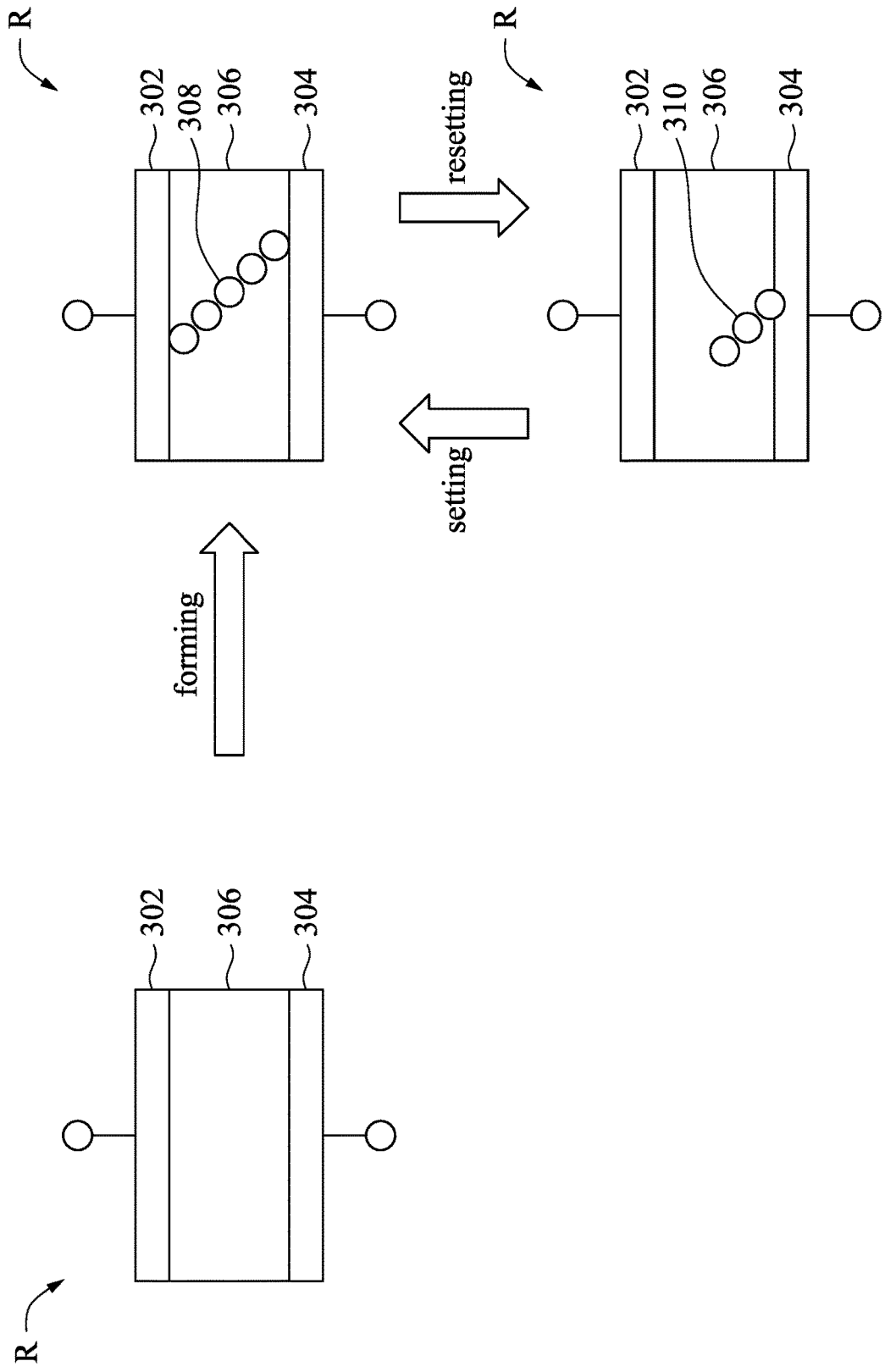
FIG. 3 is a schematic diagram illustrating operations of a resistive memory according to some embodiments of the present disclosure.

Reference is made to FIG. 3. FIG. 3 is a schematic diagram illustrating operations of the resistive memory R in FIG. 2 according to some embodiments of the present disclosure.

As illustrated in FIG. 3, the resistive memory R includes an electrode 302, an electrode 304, and an insulation layer 306. The insulation layer 306 is between the electrode 302 and the electrode 304.

When the resistive memory R is produced, the resistive memory R is in an original state. It needs to apply appropriate voltages to the electrode 302 and the electrode 304 so as to perform a forming process to the resistive memory R such that the resistive memory R can operate to be written or to be read. After the forming process, a low resistance conductive path 308 is formed and the resistive memory R is in a set state (low resistance state). By applying a reset voltage between the electrode 302 and the electrode 304, a high resistance conductive path 310 is formed and the resistive memory R is in a reset state (high resistance state). By applying a set voltage between the electrode 302 and the electrode 304, the low resistance conductive path 308 is formed again and the resistive memory R is in the set state (low resistance state) again. The set state (low resistance state) and the reset state (high resistance state) can be configured to store the logic value 1 and the logic value 0 respectively.

In the present disclosure, the forming order (i.e., the order of the forming process) is from farther positions to nearer positions relative to the drivers WDVH-WDVL. For example, the forming order is the memory cells in zone A1, the zone A2, the zone A3, and the zone A4 sequentially. In other words, the forming process is performed to the memory cells MC in the zone A1 before the forming process is performed to the memory cells MC in the zone A2, the forming process is performed to memory cells MC in the zone A2 before the forming process is performed to the memory cells MC in the zone A3, and the forming process is performed to the memory cells MC in the zone A3 before the forming process is performed to the memory cells MC in the zone A4.

Figure 4:
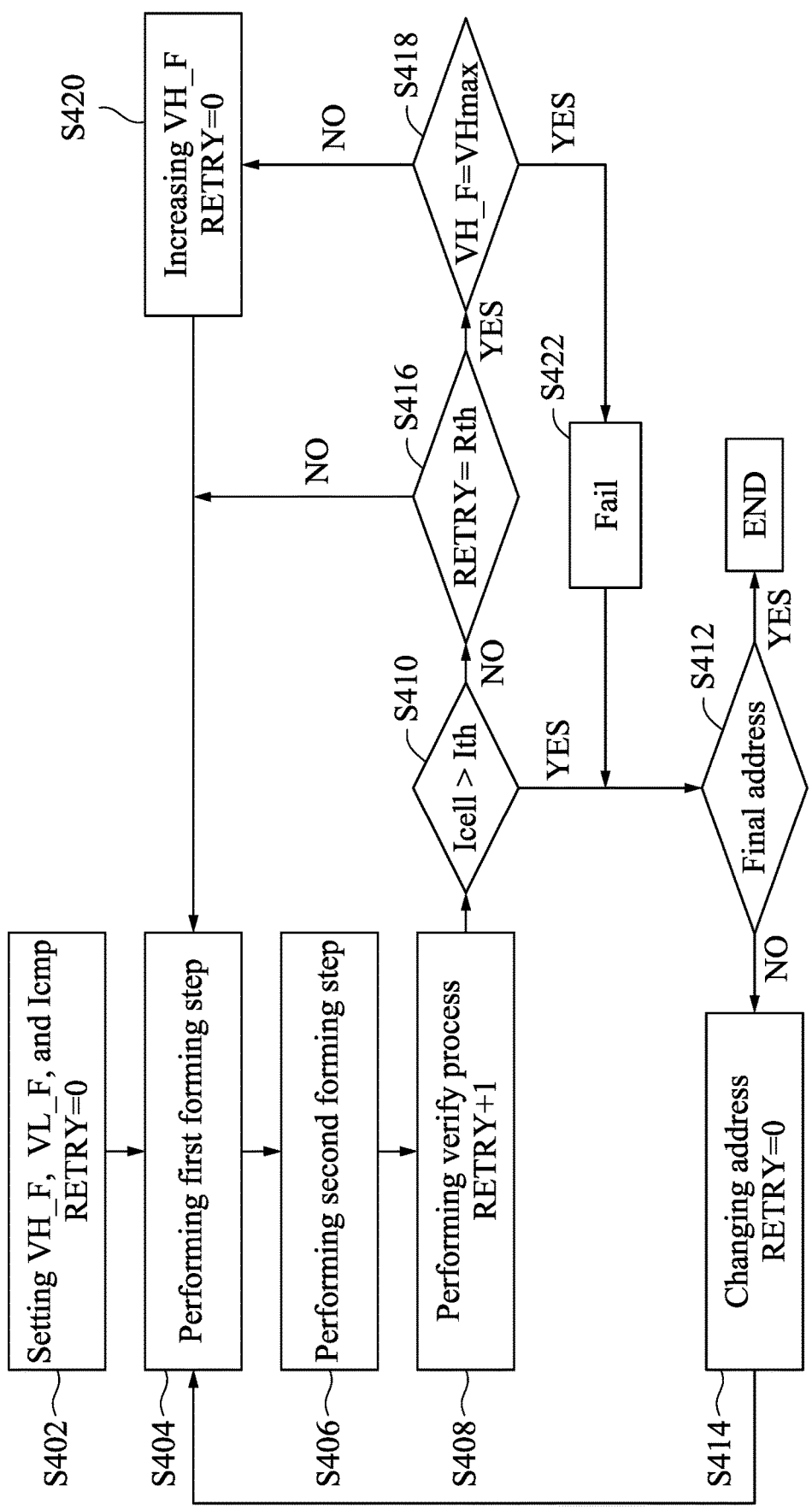
FIG. 4 is a flow diagram illustrating a forming method according to some embodiments of the present disclosure.

The details of the forming process are described in following paragraphs with reference to FIG. 4.

Reference is made to FIG. 4. FIG. 4 is a flow diagram illustrating a forming method 400 according to some embodiments of the present disclosure.

In some embodiments, the forming method 400 is implemented to the resistive memory device 100 in FIG. 1. As illustrated in FIG. 4, the forming method 400 includes operations S402, S404, S406, S408, S410, S412, S414, S416, S418, and S420.

In operation S402, the bit line voltage VH_F, the source line voltage VL_F and the compliance current Icmp have predetermined value, and the values of the bit line voltage VH_F, values of the source line voltage VL_F, and values of the compliance current Icmp are set according to the zones A1-A4. The compliance current Icmp is used to limit resistance values of the memory cells MC in a resistance value range such that the memory cells MC can be change between the set state and the reset state. In addition, a retry value RETRY is set to be an initial value (e.g., 0).

Reference is made to FIG. 5. FIG. 5 is a schematic diagram illustrating the values of the bit line voltage VH_F, the values of the source line voltage VL_F, and the values of the compliance current Icmp for the memory cell MC in the different zones A1-A4 according to some embodiments of the present disclosure.

As illustrated in FIG. 5, the first value (e.g., 3V+0V) of the bit line voltage VH_F provided to the memory cells MC in the zone A1 is less than the second value (e.g., 3V+0.1V) of the bit line voltage VH_F provided to the memory cells MC in the zone A2. The second value (e.g., 3V+0.1V) of the bit line voltage VH_F provided to the memory cells MC in the zone A2 is less than the third value (e.g., 3V+0.2V) of the bit line voltage VH_F provided to the memory cells MC in the zone A3. The third value (e.g., 3V+0.2V) of the bit line voltage VH_F provided to the memory cells MC in the zone A3 is equal to the fourth value (e.g., 3V+0.2V) of the bit line voltage VH_F provided to the memory cells MC in the zone A4. In some other embodiments, the third value (e.g., 3V+0.2V) of the bit line voltage VH_F provided to the memory cells MC in the zone A3 is less than the fourth value of the bit line voltage VH_F provided to the memory cells MC in the zone A4. Accordingly, the first value (e.g., 3V+0V) of the bit line voltage VH_F provided to the memory cells MC in the zone A1 is the smallest.

In addition, the first value (e.g., 2.5V+0V) of the source line voltage VL_F provided to the zone A1 is less than the second value (e.g., 2.5V+0.1V) of the source line voltage VL_F provided to the memory cells MC in the zone A2. The second value (e.g., 2.5V+0.1V) of the source line voltage VL_F provided to the memory cells MC in the zone A2 is less than the third value (e.g., 2.5V+0.2V) of the source line voltage VL_F provided to the memory cells MC in the zone A3. The third value (e.g., 2.5V+0.2V) of the source line voltage VL_F provided to the memory cells MC in the zone A3 is equal to the fourth value (e.g., 2.5V+0.2V) of the source line voltage VL_F provided to the memory cells MC in the zone A4. In some other embodiments, the third value (e.g., 2.5V+0.2V) of the source line voltage VL_F provided to the memory cells MC in the zone A3 is less than the fourth value of the source line voltage VL_F provided to the memory cells MC in the zone A4. Accordingly, the first value (e.g., 2.5V+0V) of the source line voltage VL_F provided to the memory cells MC in the zone A1 is the smallest.

Further, the first value (e.g., 125 µA+0 µA) of the compliance current Icmp provided to the memory cells MC in the zone A1 is less than the second value (e.g., 125 µA+25 µA) of the compliance current Icmp provided to the memory cells MC in the zone A2. The second value (e.g., 125 µA+25 µA) of the compliance current Icmp provided to the memory cells MC in the zone A2 is less than the third value (e.g., 125 µA+50 µA) of the compliance current Icmp provided to the memory cells MC in the zone A3. The third value (e.g., 125 µA+50 µA) of the compliance current Icmp provided to the memory cells MC in the zone A3 is less than the fourth value (e.g., 125 µA+75 µA) of the compliance current Icmp provided to the memory cells MC in the zone A4. Accordingly, the first value (e.g., 125 µA+0 µA) of the compliance current Icmp provided to the memory cells MC in the zone A1 is the smallest.

In operation S404, a first forming step is performed. To be more specific, the driver WDVH provides the bit line voltage VH_F to one target memory cell MC corresponding to one target address while the decoder XDE provides a gate voltage (e.g., 2.5V) to a corresponding word line (i.e., to the control terminal of the target transistor M in the target memory cell MC). As described above, the forming order is from the farther positions to the nearer positions related to the drivers WDVH-WDVL. Thus, the target memory cell MC can be, for example, the memory cell MC0 in the zone A1, and the target address is, for example, the address of the memory cell MC0. The decoder XDE provides the gate voltage (e.g., 2.5V) to the word line WL2047. In addition, since the target address belongs to the zone A1, the driver WDVH provides the bit line voltage VH_F with the first value (e.g., 3V+0V) to the bit lines BL0, and thus the first terminal of the resistive memory R of the target memory cell MC0 receives the bit line voltage VH_F with the first value. In addition, the driver WDVL provides 0V to the source line SL0, and thus the second terminal of the transistor M of the target memory cell MC0 receives 0V. Thus, a high-resistance (HR) pulse forming process is performed to the target memory cell MC0.

In operation S406, a second forming step is performed. To be more specific, the driver WDVL provides the source line voltage VL_F to the source lines and the compliance current Icmp to the target memory cell MC corresponding to at least one target address while the decoder XDE provides a gate voltage (e.g., 3V) to a corresponding word line (i.e., to the control terminal of the target transistor M in the target memory cell MC). As described above, the target memory cell MC is, for example, the memory cell MC0. Accordingly, the decoder XDE provides the gate voltage (e.g., 3V) to the word line WL2047. In addition, since the target address belongs to the zone A1, the driver WDVH provides 0V to the target bit line BL0, and the driver WDVL provides the source line voltage VL_F with the first value (e.g., 2.5V+0V), and the compliance current Icmp with the first value (e.g., 125 µA+0 µA) to the target memory cell MC0. Accordingly, the first terminal of the resistive memory R of the target memory cell MC0 receives 0V, and the second terminal of the transistor M receives the source line voltage VL_F with the first value (e.g., 2.5V+0V), and thus a low-resistance (LR) pulse forming process is performed to the target memory cell MC0.

In operation S408, a verify process is performed on the target memory cell MC corresponding to the target address, and the retry value RETRY is increased by +1. For example, the decoder XDE can provide the gate voltage (e.g., 1.2V) to the target memory cell MC0 through the word line WL2047, the driver WDVH provides a read voltage (e.g., 0.5V) to the target memory cell MC0 through the bit line BL0, and the driver WDVL provides 0V to the target memory cell MC0 through the source line SL0. Then, the read circuit READ0 can receive a reading current Icell from the target memory cell MC0 through the multiplexer YMUXR0.

In operation S410, it is determined whether a reading current Icell is greater than a threshold current Ith. As described in operation S408, the read circuit READ0 can receive the reading current Icell from the target memory cell MC. When the reading current Icell is greater than the threshold current Ith (i.e., the determination of operation S410 is YES), it represents that the forming process to the target memory cell MC is successful and it enters into operation S412. When the reading current Icell is equal to or less than the threshold current Ith (i.e., the determination of operation S410 is NO), it represents that the forming process to the target memory cell MC is failed and it enters into operation S416.

In operation S412, it is determined whether the target address is a final address. When the target address is the final address (i.e., the determination of operation S412 is YES), the forming method 400 is finished. When the target address is not the final address (i.e., the determination of operation S412 is NO), it enters into operation S414.

In operation S414, the target address is changed and the retry value RETRY is reset to be the initial value (e.g., 0). For example, the target address is changed to a new target address of a next memory cell MC (e.g., the memory cell MC1 in FIG. 1) and the retry value RETRY is reset to be 0. Then, operations S404, S406, and S408 are performed again. To be more specific, the decoder XDE provides the aforementioned gate voltages to the word line corresponding to the new target address, and the bit line voltage VH_F with a corresponding value, the source line voltage VL_F with a corresponding value, and the compliance current Icmp with a corresponding value are provided to the next memory cell MC corresponding to the new target address based on the zone that the new target address belongs to. When the new target address still belongs to the zone A1, the driver WDVH provides the bit line voltage VH_F with the first value (e.g., 3V+0V) to the target memory cell MC, and the driver WDVL provides the source line voltage VL_F with the first value (e.g., 2.5V+0V) and the compliance current Icmp with the first value (e.g., 125 μA+0 μA) to the target memory cell MC. When the new target address belongs to the zone A2, the driver WDVH provides the bit line voltage VH_F with the second value (e.g., 3V+0.1V) to the target memory cell MC, and the driver WDVL provides the source line voltage VL_F with the second value (e.g., 2.5V+0.1V) and the compliance current Icmp with the second value (e.g., 125 μA+25 μA) to the target memory cell MC. When the new target address belongs to the zone A3, the driver WDVH provides the bit line voltage VH_F with the third value (e.g., 3V+0.2V) to the target memory cell MC, and the driver WDVL provides the source line voltage VL_F with the third value (e.g., 2.5V+0.2V) and the compliance current Icmp with third value (e.g., 125 μA+50 μA) to the target memory cell MC. When the new target address belongs to the zone A4, the driver WDVH provides the bit line voltage VH_F with the fourth value (e.g., 3V+0.2V) to the target memory cell MC, and the driver WDVL provides the source line voltage VL_F with the fourth value (e.g., 2.5V+0.2V) and the compliance current Icmp with the fourth value (e.g., 125 μA+75 μA) to the target memory cell MC.

In operation S416, it is determined whether the retry value RETRY is equal to a maximum retry value Rth (e.g., 3). When the current retry value RETRY is less than the maximum retry value Rth (i.e., the determination of operation S416 is NO), it enters into operations S404, S406, and S408 again. In other words, the bit line voltage VH_F with the original value, the source line voltage VL_F with the original value, and the compliance current Icmp with the original value are provided to the original target memory cell MC again. When the retry value RETRY is equal to the maximum retry value Rth (i.e., the determination of operation S416 is YES), it enters into operation S418.

In operation S418, it is determined whether the current value of the bit line voltage VH_F is equal to a maximum bit line voltage value VHmax (e.g., 3.2V). When the current value of the bit line voltage VH_F is less than the maximum bit line voltage value VHmax (i.e., the determination of operation S418 is NO), it enters into operation S420. When the current value of the bit line voltage VH_F is equal to the maximum bit line voltage value VHmax (i.e., the determination of operation S418 is YES), it enters into operation S422.

In operation S420, the value of the bit line voltage VH_F is increased and the retry value RETRY is reset to be the initial value (e.g., 0) when the current value of the bit line voltage VH_F is less than the maximum bit line voltage value VHmax. Then, it enters into operation S404 and the increased bit line voltage VH_F with the increased value is provided to the original target memory cell MC.

In operation S422, the target address is set to be a fail address when the current value of the bit line voltage VH_F is equal to the maximum bit line voltage value VHmax. In some embodiments, the fail address is recoded into the page buffer BUF or a register (not shown).

For example, it is assumed that the target memory cell is the target memory cell MC0 in the zone A1, the maximum retry value Rth is 3, and the maximum bit line voltage value VHmax is 3.2V. In this case, operation S404 is performed three times based on the set bit line voltage VH_F with 3V. It is determined that the set bit line voltage VH_F with 3V is not equal to the maximum bit line voltage value VHmax (e.g., 3.2V) in operation S418, and the bit line voltage VH_F is increased by an incremental voltage (e.g., the bit line voltage VH_F is increased by 0.1 V and the bit line voltage VH_F is increased from 3V to 3.1V) in operation S420. Then, operation S404 is performed three times based on the set bit line voltage VH_F with 3.1V. It is determined that the set bit line voltage VH_F with 3.1V is not equal to the maximum bit line voltage value VHmax (e.g., 3.2V) in operation S418, and the bit line voltage VH_F is increased by an incremental voltage (e.g., the bit line voltage VH_F is increased by 0.1 V and the bit line voltage VH_F is increased from 3.1V to 3.2V) in operation S420. Then, operation S404 is performed three times based on the set bit line voltage VH_F with 3.2V. It is determined that the set bit line voltage VH_F with 3.2V is equal to the maximum bit line voltage value VHmax (e.g., 3.2V) in operation S418. Then, it jumps out of the retry process and the target memory cell MC0 is recorded as a fail address in operation S422.

After the target address is set to be a fail address, it enters into operation S412 to determine whether the target address is the final address. When the target address is the final address (i.e., the determination of operation S412 is YES), the forming method 400 is finished.

In the embodiments above, the target address is one address. In some other embodiments, the target address includes a plurality of word line addresses, and the word line addresses belong to one word line. In other words, in these other embodiments, operations S404, S406, S408 are performed to the word line addresses belonging to one word line, and new target addresses in operation S414 belong to an adjacent word line.

In some related approaches, the forming process is performed on the memory cells from nearer positions to farther positions relative to the driver and the forming voltage is gradually increased due to IR drop and leakage currents passing through the nearer positions. In addition, differences between the values of the source line voltage or differences between the values of the compliance current are larger due to the leakage currents passing through the nearer positions. This method makes the forming time and the forming uniformity worse.

Compared to the aforementioned related approaches, in the present disclosure, the memory cells MC are divided into the zones A1-A4, and the forming order is the zone A1, the zone A2, the zone A3, and the zone A4 sequentially (from the farther positions to the nearer positions relative to the drivers WDVH-WDVL) to avoid leakage passing through the nearer positions. In addition, the appropriate values of the bit line voltage VH_F (appropriate values of the source line voltage VL_F and the compliance current Icmp) can be provided to the memory cells MC according to their positions. Accordingly, the forming time and the forming uniformity can be better.

In some embodiments, a process circuit (not shown) or a control circuit (not shown) is configured to perform some operations in the forming method (e.g., a part of S402, a part of S408, S410, S412, S412, S414, S416, S418, a part of S420, and S422). The process circuit or the control circuit can include comparators to compare the currents and the voltages. In addition, the process circuit or the control circuit further includes a reader to access a computer program stored in a non-transitory computer readable storage medium. Then, the process circuit or the control circuit can set and reset the retry value RETRY, set the fail address, and change the address based on the computer program.

Based on the descriptions above, in the present disclosure, the forming time and the forming uniformity of the resistive memory device can be improved.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A resistive memory device, comprising:
a plurality of word lines;
a plurality of first memory cells coupled to the word lines;
a plurality of second memory cells coupled to the word lines;
a plurality of bit lines coupled to the first memory cells and the second memory cells;
a plurality of source lines coupled to the first memory cells and the second memory cells;
a driver configured to provide a forming voltage to the first memory cells and the second memory cells through the bit lines and the source lines in a forming process performed to the first memory cells and the second memory cells,
wherein a first connection length along the bit lines and the source lines between the first memory cells and the driver is longer than a second connection length along the bit lines and the source lines between the second memory cells and the driver, and the forming process is performed to the first memory cells before the forming process is performed to the second memory cells,
wherein during the forming process, a first value of the forming voltage provided to the first memory cells is less than a second value of the forming voltage provided to the second memory cells; and
a plurality of third memory cells coupled to the word lines,
wherein the second connection length along the bit lines and the source lines is longer than a third connection length along the bit lines and the source lines between the third memory cells and the driver, and the forming process is performed to the second memory cells before the forming process is performed to the third memory cells,
wherein during the forming process, the second value of the forming voltage provided to the second memory cells is less than a third value of the forming voltage provided to the third memory cells.

2. The resistive memory device of claim 1, wherein the forming voltage comprises a bit line voltage and a source line voltage, and the driver comprises:
a first driver configured to provide the bit line voltage to the bit lines; and
a second driver configured to provide the source line voltage to the source lines,
wherein during the forming process, a first value of the bit line voltage provided to the first memory cells is less than a second value of the bit line voltage provided to the second memory cells, and a first value of the source line voltage provided to the first memory cells is less than a second value of the source line voltage provided to the second memory cells.

3. The resistive memory device of claim 2, wherein during the forming process, the second value of the bit line voltage provided to the second memory cells is less than a third value of the bit line voltage provided to the third memory cells, and the second value of the source line voltage provided to the second memory cells is less than a third value of the source line voltage provided to the third memory cells.

4. The resistive memory device of claim 2, further comprising:
a multiplexer coupled to the second driver, the first memory cells, and the second memory cells, wherein the second driver is further configured to provide a compliance current to the multiplexer,
wherein during the forming process, a first value of the compliance current provided to the first memory cells is less than a second value of the compliance current provided to the second memory cells.

5. The resistive memory device of claim 4, wherein during the forming process, the second value of the compliance current provided to the second memory cells is less than a third value of the compliance current provided to the third memory cells.

6. A forming method for a resistive memory device, comprising:
setting a forming voltage provided from a driver for a plurality of first memory cells in the resistive memory device and a plurality of second memory cells in the resistive memory device, wherein a first connection length along a plurality of bit lines and a plurality of source lines between the first memory cells and the driver is longer than a second connection length along the bit lines and the source lines between the second memory cells and the driver;
performing a forming process to the first memory cells according to the forming voltage; and
performing the forming process to the second memory cells according to the forming voltage after the forming process is performed to the first memory cells,
wherein a first value of the forming voltage provided to the first memory cells is less than a second value of the forming voltage provided to the second memory cells,
wherein the forming voltage comprises a bit line voltage and a source line voltage and the driver comprises a first driver and a second driver, wherein the forming method further comprises:
providing, by the first driver, the bit line voltage to the bit lines; and
providing, by the second driver, the source line voltage to the source lines, wherein a first value of the bit line voltage provided to the first memory cells is less than a second value of the bit line voltage provided to the second memory cells, and a first value of the source line voltage provided to the first memory cells is less than a second value of the source line voltage provided to the second memory cells.

7. The forming method of claim 6, further comprising:
setting a compliance current provided from the second driver for the first memory cells and the second memory cells; and
proving, by the second driver, the compliance current to a multiplexer coupled to the second driver,
wherein a first value of the compliance current provided to the first memory cells is less than a second value of the compliance current provided to the second memory cells.

8. The forming method of claim 7, further comprising:
performing a verify process on a target memory cell of the first memory cells and the second memory cells, wherein the target memory cell corresponds to at least one target address; and
increasing a retry value from an initial value.

9. The forming method of claim 8, further comprising:
determining whether a reading current from the target memory cell is greater than a threshold current;
determining whether the at least one target address is a final address when the reading current is greater than the threshold current; and
finishing the forming method when the at least one target address is the final address.

10. The forming method of claim 9, further comprising:
determining whether the retry value is equal to a maximum retry value when the reading current is equal to or less than the threshold current;
providing the bit line voltage to the target memory cell when the retry value is less than the maximum retry value; and
determining whether a value of the bit line voltage is equal to a maximum bit line voltage value when the retry value is equal to the maximum retry value.

11. The forming method of claim 10, further comprising:
setting the at least one target address is a fail address when the value of the bit line voltage is equal to the maximum bit line voltage value;
after setting the fail address, determining whether the at least one target address is the final address; and
finishing the forming method when the at least one target address is the final address.

12. The forming method of claim 11, further comprising:
increasing the value of the bit line voltage and setting the retry value to be 0 when the value of the bit line voltage is less than the maximum bit line voltage value; and
providing the increased bit line voltage to the target memory cell.

13. The forming method of claim 11, further comprising:
changing the at least one target address when the at least one target address is not the final address; and
resetting the retry value to the initial value.

14. The forming method of claim 8, wherein the at least one target address comprises a plurality of word line addresses.

* * * * *